United States Patent [19]
Iizuka et al.

[11] Patent Number: 5,250,798
[45] Date of Patent: Oct. 5, 1993

[54] SOLID STATE IMAGE SENSOR DEVICE WITH MICROLENSES

[75] Inventors: Yasuo Iizuka, Yokohama; Akira Komatsu, Yokosuka, both of Japan

[73] Assignee: Kabushiki Kaisha Toshiba, Kawasaki, Japan

[21] Appl. No.: 813,037

[22] Filed: Dec. 24, 1991

[30] Foreign Application Priority Data

Dec. 27, 1990 [JP] Japan .................. 2-408422

[51] Int. Cl.$^5$ ............................. H01J 40/14
[52] U.S. Cl. ..................... 250/208.1; 250/216; 257/432
[58] Field of Search ............ 250/208.1, 211 R, 211 J, 250/216; 357/30 M, 30 H; 358/213.13, 213.27, 483; 257/432, 443

[56] References Cited

U.S. PATENT DOCUMENTS

| | | | |
|---|---|---|---|
| 4,553,036 | 11/1985 | Kawamura et al. | 250/208.1 |
| 4,667,092 | 5/1987 | Ishihara | 250/208.1 |
| 5,118,924 | 6/1992 | Mehra et al. | 250/211 J |

OTHER PUBLICATIONS

"A High Photosensitivity IL-CCD Image Sensor With Monolithic Resin Lens Array", Y. Ishihara et al. IEDM 83, pp. 497-500 (1983).

*Primary Examiner*—David C. Nelms
*Assistant Examiner*—K. Shami
*Attorney, Agent, or Firm*—Foley & Lardner

[57] ABSTRACT

A solid state image sensor device has a semiconductor substrate, picture elements arranged on the semiconductor substrate in a matrix, and microlenses. Each microlens is arranged with a plurality of single-layer microlens parts on each picture element for condensing an incident light transferred from outside of the solid state image sensor device.

6 Claims, 7 Drawing Sheets

UNIT CELL 16
(PICTURE ELEMENT)

SOLID STATE IMAGE SENSOR DEVICE WITH MICROLENSES

BACKGROUND OF THE INVENTION

1. Field of the Invention

The present invention relates to a solid state image sensor device provided with a microlens which condenses the incident light, and, in particular, to the structure of this microlens.

2. Description of the Prior Art

In a conventional solid state image sensor device 1, as shown in FIG. 1, the incident light normally passes through a camera lens 6 and is focused, after which this incident light is sensed by a picture element 7 having a photosensitive member (not shown), built into the solid state image sensor device 1.

An electric charge produced by photoelectric conversion in the photosensitive member is then transmitted through a vertical charge coupled device (vertical CCD) 8 and a horizontal CCD 9 and discharged from the solid state image sensor device 1 to an external device in the form of a video signal.

Much consideration has been given to methods of improving the sensitivity of the solid state image sensor device 1 such as, for example, by providing a microlens on the surface of the solid state image sensor device 1 which receives the incident light.

FIG. 3 illustrates a solid state image sensor device which is formed on a semiconductor substrate using a structure which provides a microlens for condensing the incident light. In FIG. 3, the solid state image sensor device 1 comprises a photosensitive member 2, for example, a photodiode, which photoelectrically converts the incident light directed onto a surface of the solid state image sensor device 1 to produce an electric charge, and a transmission member, for example, a vertical CCD 8, which transmits this electric charge to an external device. In addition, a transparent flat layer 4 is formed in a level plane on the surface of the solid state image sensor device 1 above the photosensitive members 2 and the vertical CCDs 8. A plurality of microlenses 5 is provided, patterned in a hemispherical shape to correspond to the respective photosensitive members 2 or patterned in a semicolumnar shape, specifically, a striped shape, to correspond to one row of the photosensitive members 2. The microlenses 5 are formed by melting, solidifying and annealing a lens material.

A solid state image sensor device with this type of structure is described in the literature (Y. Ishihara et al.; IEDM 83, p. 497 (1983)). With such a device it is possible to improve the sensitivity to about double that of the case where the microlenses are not formed.

In a solid state image sensor device with this type of structure, used, for example, in a camera such as a video camera, the sensitivity or the smear characteristics of the solid state image sensor device are improved when the incident light passes through a camera lens. Specifically, these characteristics change according to the change in the F value of the camera lens (F=f/D, where F is the brightness, f is the focal distance, and D is the aperture of the camera lens).

The relationship between the relative sensitivity of the solid state image sensor device 1 and the F value of the camera lens 6 is shown in FIG. 4. As can be clearly understood from FIG. 4, which shows the case where the film thickness of the microlens 5 changes between 2.3 μm and 2.8 μm, as the F value of the camera lens 6 decreases, the relative sensitivity of the solid state image sensor device 1 also decreases.

As shown in FIG. 5, the change in the F value is based on the relation between the aperture D and the angle of vision $\theta$ of the camera lens 6. For example, as the F value of the camera lens 6 decreases, the angle of vision $\theta$ increases, which means that the incident light enters obliquely. When F=1.4, for example, the angle of vision $\theta=19.7°$, and when F=11 the angle of vision $\theta=2.6°$. As a result, when the angle of vision increases in accordance with a decrease in the F value, as shown in FIG. 6, compared to the case where the F value is large the optical path of the incident light changes, and the incident light has difficulty in entering the photosensitive member 2 of the solid state image sensor device 1.

Accordingly, the amount of light provided to the photosensitive member 2 decreases and the sensitivity also decreases. However, in a camera using the solid state image sensor device 1, such as a video camera, not only is a size reduction required, but a small F value and a high sensitivity must also be provided. As outlined in the foregoing explanation, when a video camera or the like is incorporated in a conventional solid state image sensor device 1, a reduction in the F value of the camera lens 5 is accompanied by a decrease in the relative sensitivity.

For this reason, when the size of the camera lens 5 of a video camera or the like is reduced, a solid state image sensor device with a small F value and a high sensitivity is required. However, it is impossible to meet these requirements.

SUMMARY OF THE INVENTION

Accordingly, an object of the present invention is to provide, with due consideration to the drawbacks of such conventional devices, a solid state image sensor device in which a high sensitivity is obtained even with a relatively small F value, and which can contribute to reducing the size and increasing the sensitivity of an imaging camera such as a video camera.

This object is achieved in the present invention by the provision of a solid state image sensor device on which a plurality of condensing lenses are formed, for example each lens constructed in a plurality of layers, for condensing the incident light on a plurality of photosensitive members corresponding to a plurality of photosensitive members formed on a semiconductor substrate. In the solid state image sensor device of the above-described configuration, the amount of incident light which enters the photosensitive members is increased by the condensing lenses constructed in layers.

A solid state image sensor device, as a preferred embodiment according to the present invention, comprising:

a semiconductor substrate;

a plurality of picture elements formed on the semiconductor substrate in matrix; and a plurality of microlenses, each formed with a single-layer microlens having a space in the center of the microlens on each picture element, for condensing an incident light transferred from outside of the solid state image sensor device.

A solid state image sensor device, as another preferred embodiment according to the present invention, comprises:

a semiconductor substrate;

a plurality of picture elements formed on the semiconductor substrate in matrix; and a plurality of microlenses, each formed with a plurality of single-layer microlens parts on each picture element, for condensing an incident light transferred from outside of the solid state image sensor device.

In addition, in the solid state image sensor device described above, each microlens formed with a pair of single-layer microlenses for accommodating to the picture element.

Further, in the solid state image sensor device, each microlens formed with a four parts of single-layer microlenses for accommodating to the picture element.

A solid state image sensor device, as another embodiment according to the present invention, comprises:

a semiconductor substrate;

a plurality of picture elements formed on the semiconductor substrate in matrix;

a plurality of horizontal CCDs formed along a row of the picture elements;

a plurality of vertical CCDs formed along a column of the picture elements; and a plurality of microlenses, each formed with a multilayer structure, for condensing an incident light transferred from outside of the solid state image sensor device.

In addition, in the solid state image sensor device, the microlens has a two-layer structure, the first microlens layer is formed with a semicylinder shape to one column of the picture elements along the vertical CCD line, and the second microlens layer having a double lens structure is formed by each picture element on the first microlens layer.

Further, in the solid state image sensor device, the microlens has a two-layer structure, the first microlens layer is formed with a semicylinder shape to one column of the picture elements along the vertical CCD line, and the second microlens layer having four part lens structure is formed by each picture element on the first microlens layer.

These and other objects, features, and advantages of the present invention will become more apparent from the following description of the preferred embodiments taken in conjunction with the accompanying drawings.

DETAILED DESCRIPTION OF THE PREFERRED EMBODIMENTS

Other features of this invention will become apparent in the course of the following description of exemplary embodiments which are given for illustration of the invention and are not intended to be limiting thereof.

An embodiment of the present invention will now be described with reference to the drawings.

Figure 1:
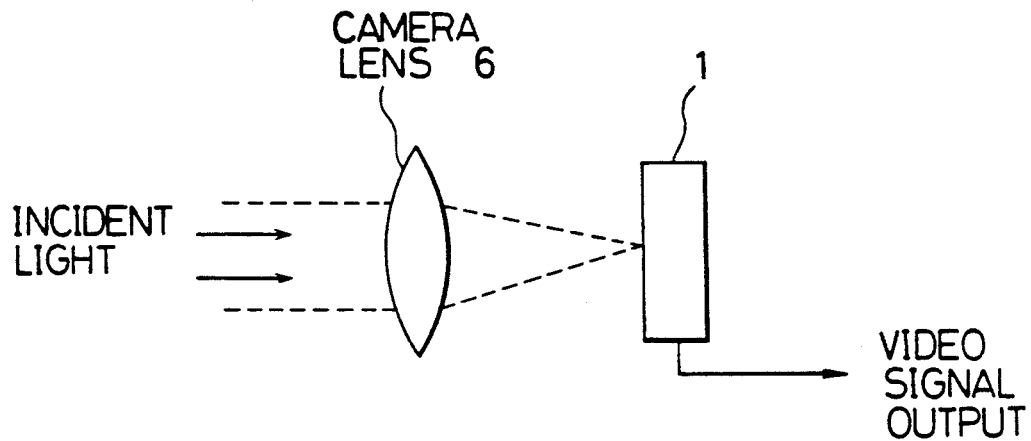
FIG. 1 is a schematic diagram of a conventional solid state image sensor device having a camera lens.
Figure 2:
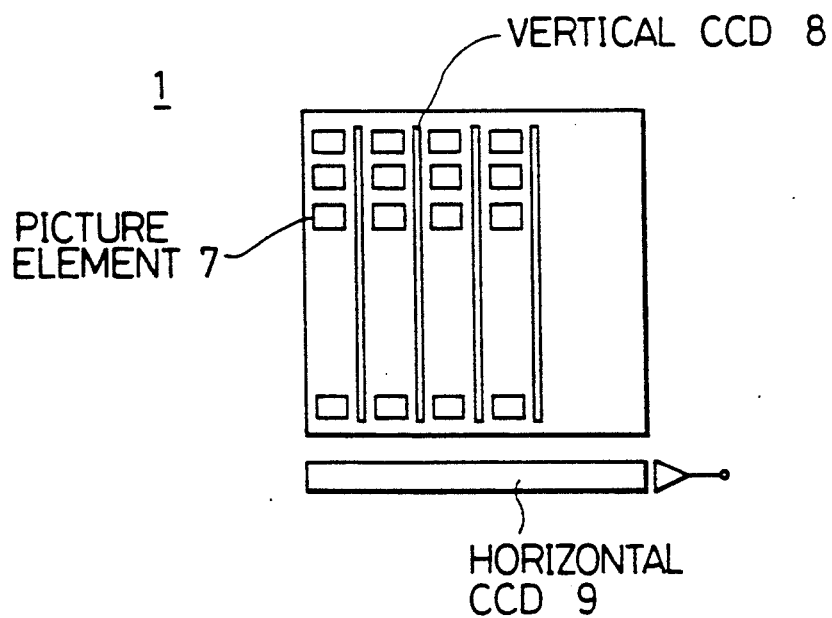
FIG. 2 is a schematic plan view according to the conventional solid state image sensor device shown in FIG. 1.
Figure 3:
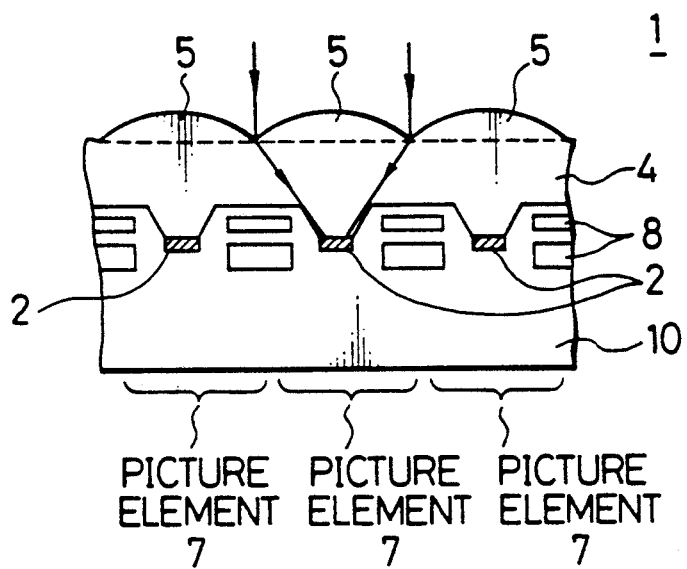
FIG. 3 is a sectional diagram of the conventional solid state image sensor device with a plurality of microlenses shown in FIG. 2.
Figure 4:
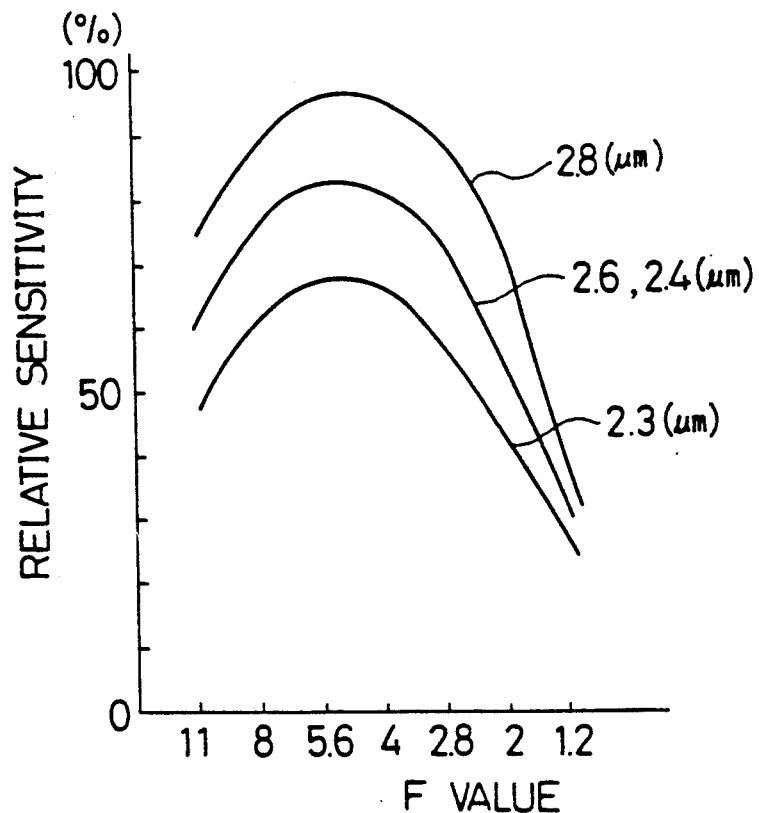
FIG. 4 is a relationship between the relative sensitivity of the conventional solid state image sensor device shown in FIG. 1 and the F value of the camera lens.
Figure 5:
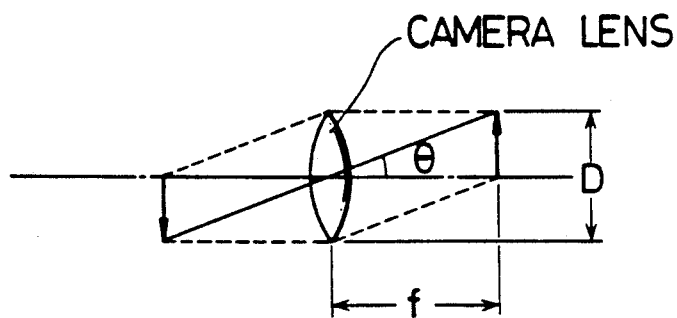
FIG. 5 is a relationship among the angle of vision $\theta$, the aperture of the camera lens D, the focus distance f for the camera lens in the conventional solid camera image sensor device shown in FIG. 1.
Figure 6:
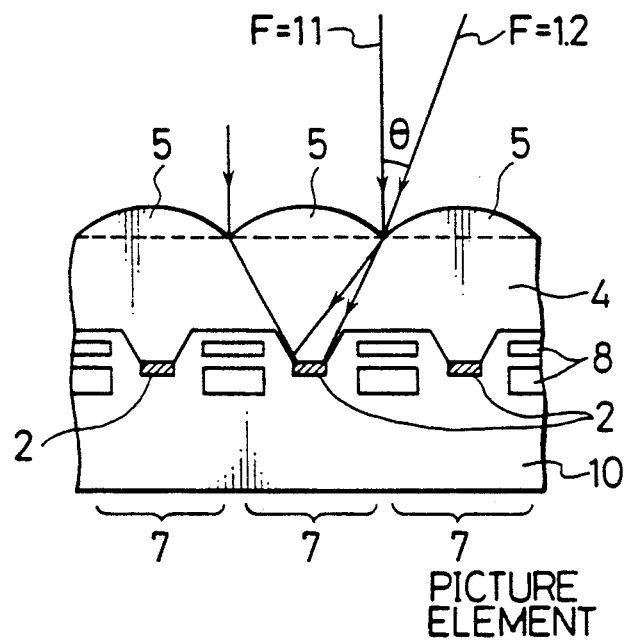
FIG. 6 is a sectional drawing for explaining the relationship between the angle $\theta$ of vision and the F value of the conventional solid state image sensor device shown in FIG. 1.
Figure 7:
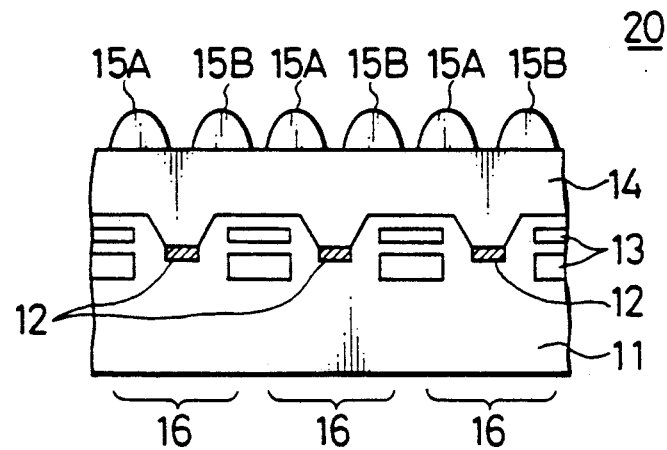
FIG. 7 is a sectional drawing of a solid state image sensor as a first embodiment of the present invention.

FIG. 7 is a sectional drawing of a first embodiment of a solid state image sensor device of the present invention.

In the drawing, a solid state image sensor device 20 comprises a plurality of picture elements on each of which is positioned a pair of single-layer microlenses 15A and 15B accommodated by one photosensitive member 12.

As shown in FIG. 7, a flat layer 14 is formed over both the photosensitive members 12 and a plurality of electric charge transmitters 13 which are arranged in the form of a matrix on a semiconductor substrate 11.

Figure 8:
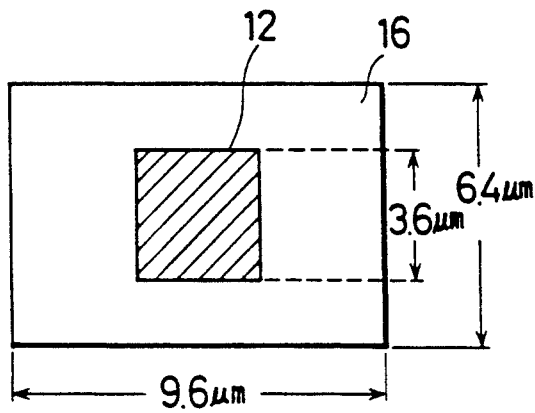
FIG. 8 is a plan view explaining an area of a photosensitive member in the solid state image sensor device of the present invention which is applied to a PLA type of television system.

In addition, the pair of microlenses 15A and 15B for each photosensitive member 12 is formed on the flat layer 14. When this sort of structure is applied to a solid state image sensor device for a PLA type of television system (625 scanning lines) with, for example, 320,000 picture elements, the area occupied by the photodiode of the photosensitive member 12 is $3.0\mu \times 3.5\mu$ for a unit cell (picture element) 16 with an area of $6.4\mu \times 9.6\mu$, as shown in FIG. 8.

Figure 9:
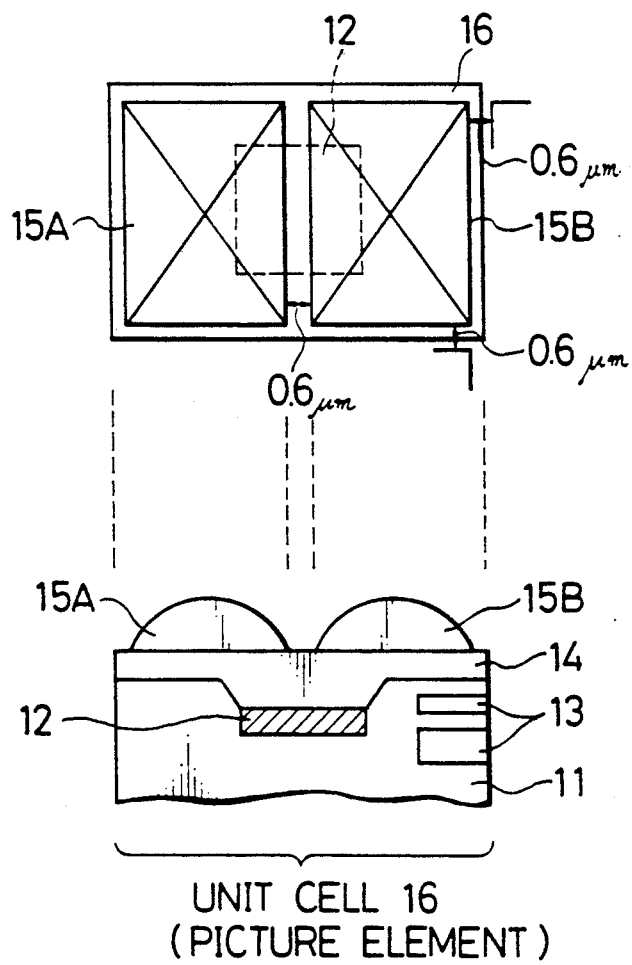
FIG. 9 is a diagram showing a planar relationship for a photosensitive member.

Further, the areas of the unit cell 16 and the photosensitive member 12 change according to whether the television system is the NTSC system or the highvision system, and according to the design method, and the present invention does not depend on the relative size of these areas. The planar relationship of the two microlenses 15A and 15B and the one photosensitive member 12 for these types of unit cell 16 and photosensitive member 12 shown in FIG. 7 is shown in FIG. 9.

Next, one method of manufacturing the solid state image sensor device with this type of structure is described with reference to FIG. 10 and FIG. 11 which are sectional views showing the manufacturing method.

Figure 10:
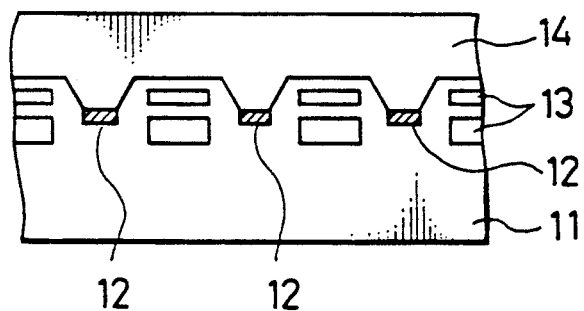
FIGS. 10 and 11 are sectional views showing a fabrication steps for the solid state image sensor device of the present invention.
Figure 11:
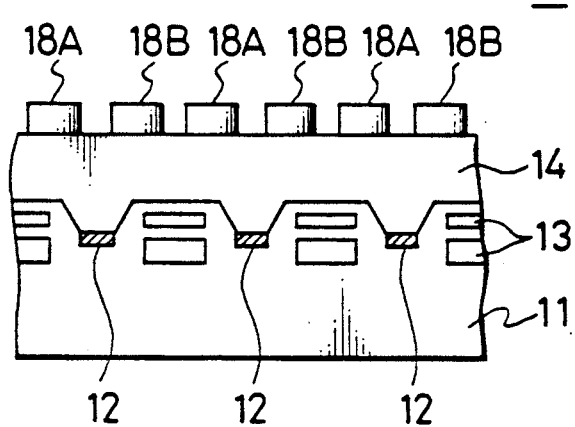

First, as shown in FIG. 10, after the photosensitive members 12 and the electric charge transmitters 13 are formed on the semiconductor substrate 11, the flat layer 14 is formed to a thickness of 5.0 μm to provide a flat surface.

Next, a plurality of lens material units 18A and 18B for forming the microlenses 15A and 15B is coated onto the flat layer 14 to a thickness of about 2.0 μm. After this, the two lens material units 18A and 18B are patterned as shown in FIG. 9 to form the two microlenses 15A, 15B for one photosensitive member 12. The microlens material should be transparent and sensitive to incident light, and should have qualities which allow extremely fine processing. For example, a styrene-related organic resin is a suitable material.

When the microlenses are formed, about 400 ms of exposure is performed by a stepper exposure device from an i-line spectrum from a super-high pressure mercury (HG) lamp, followed by developing in about a 5% aqueous solution of TMAH. As shown in FIG. 9, striped blocks of the patterned lens material units 18A and 18B are obtained at a 0.6 μm spacing from one photosensitive member 12 (FIG. 10, FIG. 11).

Finally, after the lens material units 18A, 18B are exposed and become transparent, these lens material units 18A, 18B are baked for 10 minutes at 150° C. and heat cured. As a result, the microlenses 15A and 15B are formed in the configuration shown in FIG. 7. In the solid state image sensor device with the structure obtained in this manner, even in the case where the F value is small, specifically, when the angle of incidence of the incident light is large, the optical path of the incident light is controlled so that the incident light enters the photosensitive member 12 obliquely from the microlenses 15A, 15B. As a result, the amount of incident light is increased as compared with a conventional device, making it possible to improve the sensitivity.

Figure 12:
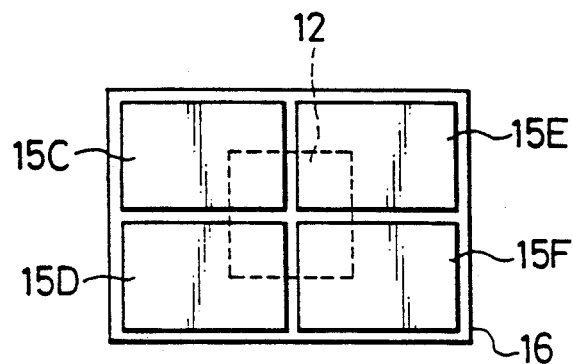
FIG. 12 is a solid state image sensor device in which each photosensitive member has four part microlenses as another embodiment of the present invention.

Next, further embodiments of a solid state image sensor device of the present invention will be described wherein, for example, four microlenses 15C, 15D, 15E, 15F are provided as one microlens having the four parts for one photosensitive member 12, as shown in FIG. 12, or wherein a microlens 21 is provided from a pattern wherein one microlens is formed completely over a unit cell 16 with the exception of an open section 20.

Figure 14:
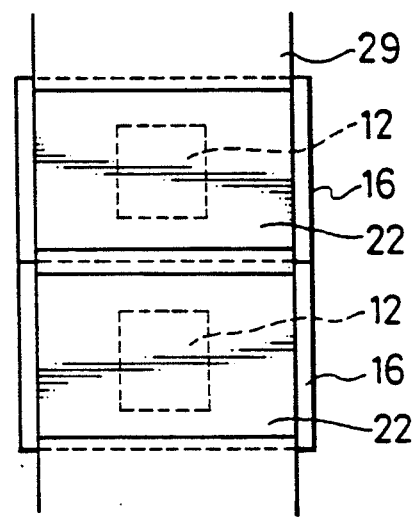
FIGS. 14 and 15 are plan views for a solid state image sensor device, in which a microlens in each photosensitive member has a double lens structure a first layer and a second layer, as another embodiment of the present invention.
Figure 13:
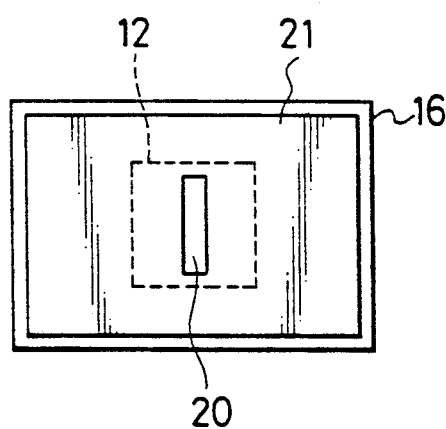
FIG. 13 is a plan view of a solid state image sensor device, in which each photosensitive member has one part microlens with the exception of an open section, as another embodiment of the present invention.
Figure 15:
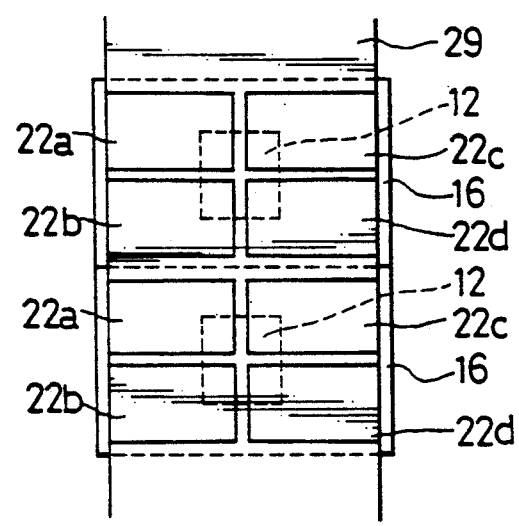

In other embodiments, a microlens with a multilayer structure is provided. In the case of a two-layer structure, for example, as illustrated in FIG. 14, a semicylinder first-layer microlens 29, with a stripe shape along the vertical CCD line direction and a film thickness of about 1.3 μm, is formed to correspond to one column of photosensitive members. Following this, a microlens of a double lens structure which forms a second-layer microlens 22 formed on each unit cell 16, as shown in FIG. 15, and a second-layer microlens divided into four parts 22a, 22b, 22c, and 22d for each unit cell 16 are formed.

Figure 16:
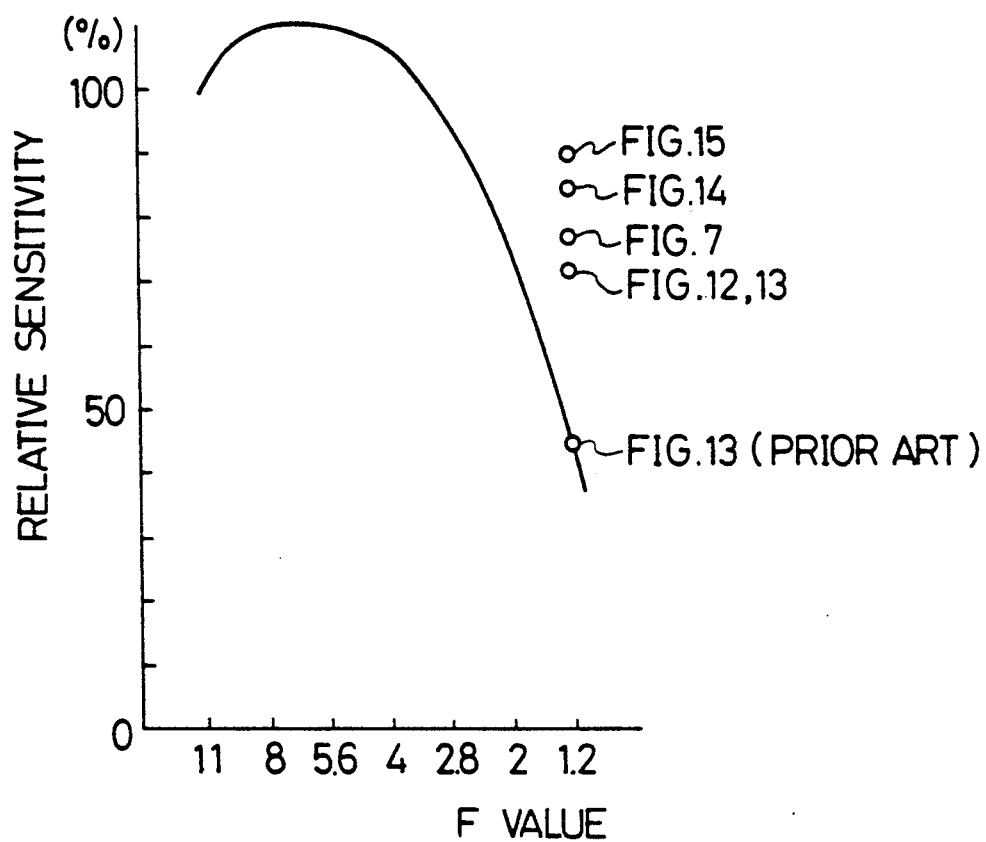
FIG. 16 is a diagram showing the relative sensitivity at F=1.2 for the solid state image sensor devices of the present invention shown in FIGS. 7, 12, 13, 14, and 15.

All the solid state image sensor devices of the present invention on which are formed microlenses with such structures have relative sensitivities at F=1.2 which are higher than those of all conventional types, as shown in FIG. 16.

As outlined in the foregoing explanation, by means of the solid state image sensor device of the present invention, a number of condensing lenses (microlenses), or, a multiple layer microlens, are provided for the various photosensitive members, which increase the amount of incident light directed onto the respective photosensitive members.

Accordingly, even with a solid state image sensor device with a relatively small F value, a high sensitivity can be achieved, making it possible to provide an imaging camera such as a video camera and the like, with a high sensitivity but small physical dimensions.

Various modifications will become possible for those skilled in the art after the teaching of the present disclosure without departing from the scope thereof.

What is claimed is:

1. A solid state image sensor device comprising:
a semiconductor substrate;
a plurality of picture elements arranged on the semiconductor substrate in a matrix; and
a plurality of microlenses, each of said microlenses arranged with a single-layer microlens on each of said picture elements, such that said microlenses are spaced apart from each other for condensing an incident light transferred from outside of the solid state image sensor device.

2. A solid state image sensor device comprising:
a semiconductor substrate;
a plurality of picture elements arranged on the semiconductor substrate in a matrix; and
a plurality of microlenses, each of said microlenses having a plurality of single-layer microlens parts positioned on each of said picture elements, for condensing an incident light transferred from outside of the solid state image sensor device.

3. A solid state image sensor device according to claim 2, wherein each of said microlenses has a pair of single-layer microlens parts positioned on each of said picture elements.

4. A solid state image sensor device according to claim 2, wherein each of said microlenses has four single-layer microlens parts positioned on each of said picture elements.

5. A solid state image sensor device comprising:
a semiconductor substrate;
a plurality of picture elements arranged on the semiconductor substrate in a matrix;
a plurality of horizontal CCDs formed along a row of the picture elements;
a plurality of vertical CCDs formed along a column of the picture elements; and
a plurality of microlenses for condensing an incident light transferred from outside of the solid state image sensor device,
wherein each of said microlenses has a two-microlens-layer structure including a first-microlens-layer and a second-microlens-layer, the first-microlens-layer is arranged in a semi-cylindrical shape in one column of the picture elements along the vertical CCD line, and the second-microlens-layer having a double lens structure is arranged by each of said picture elements in the first-microlens-layer.

6. A solid state image sensor device comprising:
a semiconductor substrate;
a plurality of picture elements arranged on the semiconductor substrate in a matrix;
a plurality of horizontal CCDs formed along a row of the picture elements;
a plurality of vertical CCDs formed along a column of the picture elements; and
a plurality of microlenses for condensing an incident light transferred from outside of the solid state image sensor device, wherein each of said microlenses has a two-microlens-layer structure having a first-microlens-layer and a second-microlens-layer, the first-microlens-layer is arranged in a semi-cylindrical shape in one column of the picture elements along the vertical CCD line, and the second-microlens-layer having a four-part lens structure is arranged by each of picture elements in the first-microlens-layer.

* * * * *